United States Patent
Jung et al.

(10) Patent No.: US 7,830,708 B1
(45) Date of Patent: Nov. 9, 2010

(54) COMPENSATING FOR VARIATIONS IN MEMORY CELL PROGRAMMED STATE DISTRIBUTIONS

(75) Inventors: Chulmin Jung, Eden Prairie, MN (US); Yong Lu, Edina, MN (US); Harry Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 87 days.

(21) Appl. No.: 12/428,002

(22) Filed: Apr. 22, 2009

(51) Int. Cl.
*G11C 16/00* (2006.01)
(52) U.S. Cl. .......................... 365/185.03; 365/185.09
(58) Field of Classification Search ............. 365/185.02
See application file for complete search history.

(56) References Cited

U.S. PATENT DOCUMENTS

| | | | |
|---|---|---|---|
| 4,517,672 A | 5/1985 | Pfleiderer et al. | |
| 5,163,021 A * | 11/1992 | Mehrotra et al. | 365/185.03 |
| 6,069,821 A * | 5/2000 | Jun et al. | 365/185.21 |
| 6,850,454 B2 | 2/2005 | Kuge et al. | |
| 7,088,615 B2 * | 8/2006 | Guterman et al. | 365/185.03 |
| 7,397,702 B2 * | 7/2008 | Rolandi et al. | 365/185.22 |
| 7,443,751 B2 | 10/2008 | Miller et al. | |
| 7,450,419 B2 | 11/2008 | Sakashita et al. | |
| 7,729,165 B2 * | 6/2010 | Wang | 365/185.03 |
| 2007/0247938 A1 | 10/2007 | Miller et al. | |
| 2007/0253265 A1 | 11/2007 | Miller et al. | |

* cited by examiner

*Primary Examiner*—Tan T. Nguyen
(74) *Attorney, Agent, or Firm*—Fellers, Snider et al.

(57) ABSTRACT

Method and apparatus for compensating for variations in memory cell programmed state distributions, such as but not limited to a non-volatile memory formed of NAND configured Flash memory cells. In accordance with various embodiments, a memory block is formed from a plurality of memory cells that are arranged into rows and columns within the memory block, each memory cell configured to have a programmed state. A selected row of the memory block is read by concurrently applying a stepped sequence of threshold voltages to each memory cell along the selected row while sequentially decoupling read current from groups of memory cells along the selected row as the programmed states of said groups of cells are successively determined.

20 Claims, 6 Drawing Sheets

FIG. 10

COMPENSATING FOR VARIATIONS IN MEMORY CELL PROGRAMMED STATE DISTRIBUTIONS

BACKGROUND

Data storage devices generally operate to store and retrieve user data in a fast and effective manner. Some data storage devices utilize solid-state memory elements (cells) to store the user data, such as in the case of a solid-state drive (SSD). The memory cells can be volatile or non-volatile, and can take a variety of constructions such as but not limited to dynamic random access memory (DRAM), static random access memory (SRAM), Flash, electrically erasable programmable read only memory (EEPROM), spin-torque transfer random access memory (STRAM), and resistive random access memory (RRAM).

The cells can be programmed to store data in relation to a given programmed state. The programmed state can be sensed by applying a read current to the cell and comparing a voltage associated with the cell to a suitable reference voltage using a sense amplifier. Each cell can be used to store a single bit of user data, or can be used to store multiple bits of user data.

The cells can be arranged within a memory array so as to be individually accessible during a read operation so that the programmed state of each cell can be determined individually. Alternatively, the cells can be arranged so that a selected amount of data (e.g. a page of data, etc.) is concurrently read out of the array during a given read operation.

A given cell programmed state will generally provide a nominal readback characteristic during a read operation. Different cells in an array that are programmed to the same programmed state may exhibit variations in these readback characteristics. Such variations in memory cell programmed state distributions can make it difficult to reliably select appropriate reference voltages to distinguish between the various cell programmed states.

SUMMARY

Various embodiments of the present invention are generally directed to an apparatus and method for compensating for variations in memory cell programmed state distributions, such as but not limited to a non-volatile memory block formed of NAND configured Flash memory cells in which each cell stores two or more bits of user data.

In accordance with some embodiments, a method is provided for use with a memory block comprising a plurality of memory cells arranged into rows and columns and each memory cell configured to have a programmed state. The method generally comprises reading a selected row of the memory block by concurrently applying a stepped sequence of threshold voltages to each memory cell along the selected row while sequentially decoupling read current from groups of memory cells along the selected row as the programmed states of said groups of cells are successively determined.

In accordance with other embodiments, an apparatus generally comprises a memory block comprising a plurality of memory cells arranged into rows and columns, with each memory cell configured to have a programmed state. A read circuit is coupled to the memory block and is configured to read a selected row of the memory block by concurrently applying a stepped sequence of threshold voltages to each memory cell along the selected row while sequentially decoupling read current from groups of memory cells along the selected row as the programmed states of said groups of cells are successively determined.

These and other features and advantages which characterize the various embodiments of the present invention can be understood in view of the following detailed discussion and the accompanying drawings.

DETAILED DESCRIPTION

The present disclosure relates to reading the programmed states of memory cells, and in particular to methods and devices that may be used to compensate for variations in programmed state distributions in memory cells, whether used with or without additional error correction routines. In accordance with exemplary embodiments, a plurality of memory cells are arranged in rows and columns as a memory block. Reading a selected row of the memory block proceeds by concurrently applying a stepped sequence of threshold voltages to each memory cell along the selected row. Read current is sequentially decoupled from groups of memory cells along the selected row as the programmed states of said groups of cells are successively determined.

Figure 1:
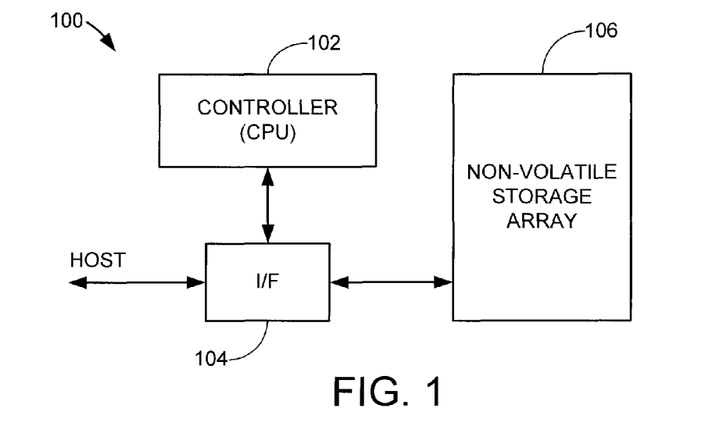
FIG. 1 provides a functional block representation of a data storage device constructed and operated in accordance with various embodiments of the present invention.

FIG. 1 provides a functional block representation of a data storage device 100 to illustrate an exemplary environment in which various embodiments of the present invention can be advantageously practiced. While not limiting, for purposes of the present discussion it will be contemplated that the device 100 is characterized as a solid-state drive (SSD) that utilizes Flash memory.

The device 100 includes a top level controller 102, an interface (I/F) circuit 104 and a non-volatile data storage array 106. The I/F circuit 104 operates under the direction of the controller 102 to transfer user data between the array 106 and a host device (not shown). In some embodiments, the controller 102 is a programmable microcontroller. Data can be buffered in the I/F circuit 104 pending a transfer of the data between the array 106 and the host device.

Figure 2:
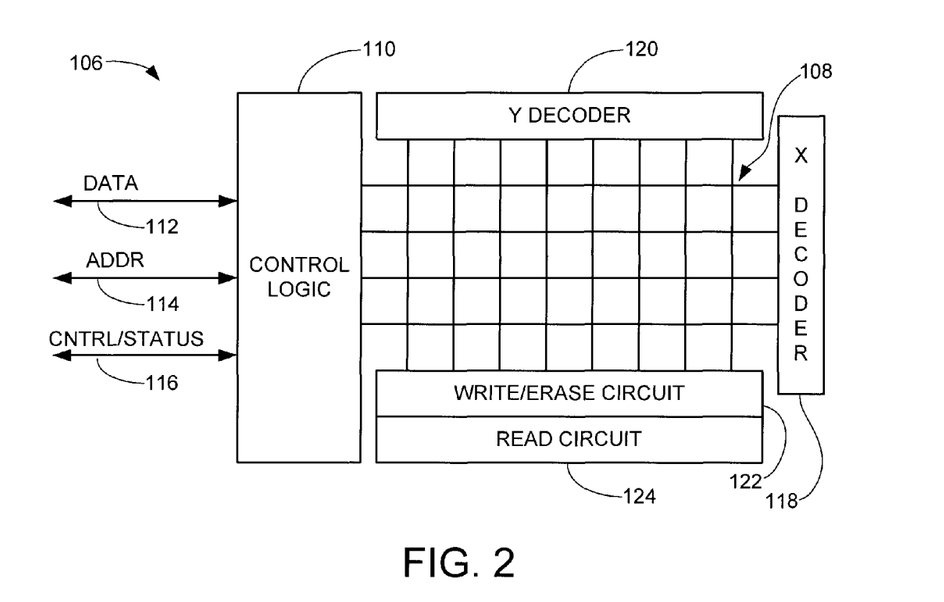
FIG. 2 shows a functional block representation of a portion of the memory array of the device of FIG. 1.

FIG. 2 provides a functional representation of portions of the array 106. A number of non-volatile memory cells 108 are arranged in rows and columns. Control logic 110 controls data transfers between the array 106 and the I/F 104 (FIG. 1). Data, addressing and control/status signals are transferred via paths 112, 114 and 116, respectively.

The cells 108 are coupled via various control lines to an X (row) decoder 118 and a Y (column) decoder 120. A write/erase circuit 122 operates to carry out write and erase operations with the cells 108. A read circuit 124 operates to carry out read operations with the cells 108. It will be appreciated that the arrangement of FIG. 2 is merely exemplary in nature. Any number of different configurations can be utilized depending on the requirements of a given application.

Figure 3:
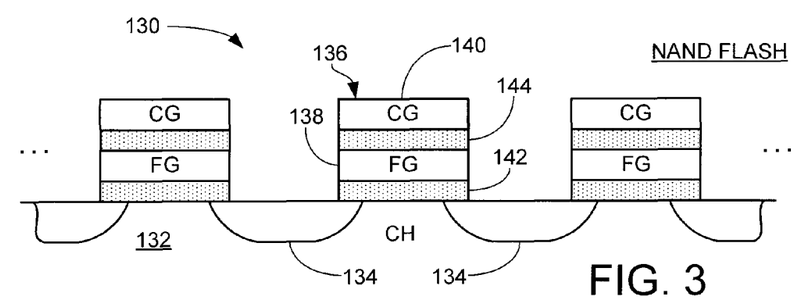
FIG. 3 illustrates a number of memory cells of the array of FIG. 2, which in some embodiments are characterized as non-volatile Flash memory cells arranged in a NAND configuration.

FIG. 3 shows a number of the memory cells of FIG. 2 characterized as Flash memory cells 130 arranged in a NAND configuration. A substrate 132 includes spaced apart, localized doped regions 134. Adjacent pairs of the doped regions 134 are spanned by gate structures 136 each comprising a floating gate (FG) 138, a control gate (CG) 140, and respective insulating oxide layers 142, 144.

The Flash memory cells 130 each substantially operate as a modified n-channel metal oxide semiconductor field effect transistor (MOSFET). Application of a suitable gate voltage to the floating gate (FG) 138 establishes a conductive channel (CH) between the adjacent doped regions 134, thereby generating a drain-to-source conductivity path.

During a programming operation, a write current through the channel results in the passage of charge through the lower oxide layer 142 to the floating gate (FG) 138. The presence of accumulated charge on the floating gate 138 serves to alter the requisite threshold voltage $V_T$ that needs to be applied to the control gate 140 to establish conductivity through the channel. Hence, the Flash memory cell 130 can store different programmed values in relation to different amounts of accumulated charge on the floating gate 138.

Figure 4:
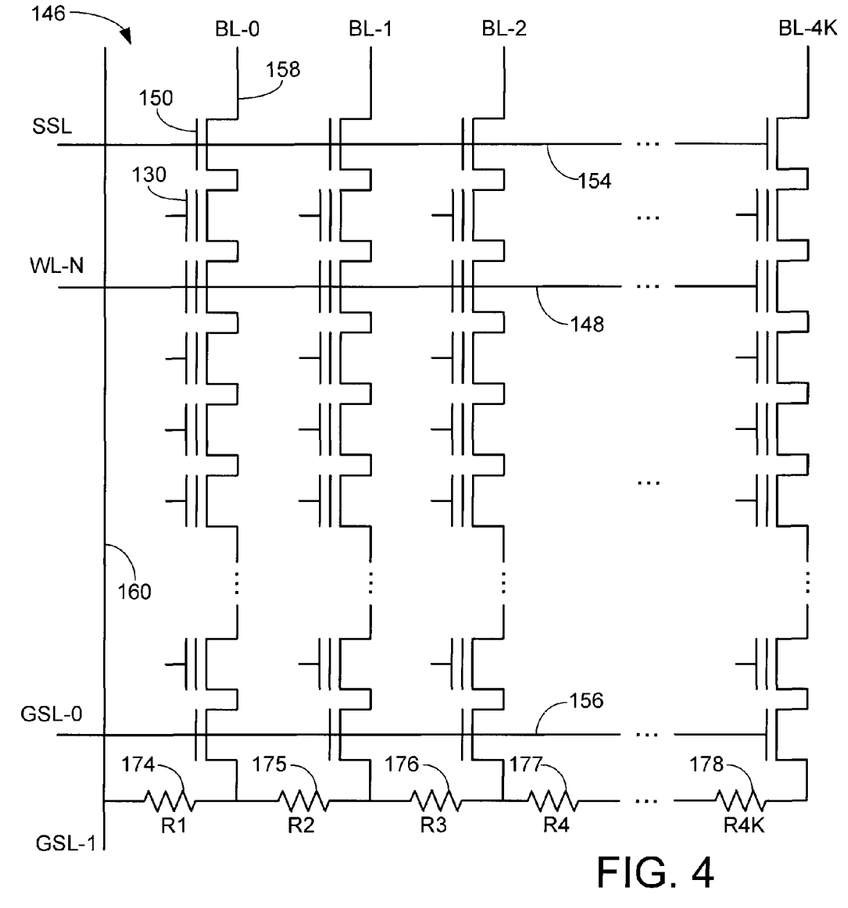
FIG. 4 is a schematic depiction of a portion of the array of FIG. 2 with the Flash memory cells of FIG. 3 during a read operation.

Data can be read from the Flash memory cells 130 as shown in FIG. 4. In some embodiments, the array 106 is arranged into a number of subsets, or blocks 146 of memory cells, which are in turn arranged into rows and columns of individual cells. While any number of sizes can be used, an exemplary block size for the block 146 can be 32 rows by 4K (4096) columns. Each cell 130 is contemplated as storing 2 bits of user data. Using 8-bit bytes, each row thus stores (2*4096)/8=1024 bytes, and the entire block 146 can store 1024*32=32,768 bytes, or 32 KB, not counting spare bytes. As noted above, these values are merely exemplary and are not limiting.

The control gates (CG) 140 of the cells 130 along each row are connected to a common word line 148, such as the exemplary word line WL-N for row N. The cells 130 along each column are connected in a NAND configuration such as depicted in FIG. 3. Control transistors (MOSFETs) 150, 152 are located at each end of each column. The gates of the upper transistors 150 are connected to a high level source line (SSL) 154, and the gates of the lower transistors 152 are connected to a low level global source line (GSL-0) 156. The drain of each upper transistor 150 is connected to a bit line 158 (denoted BL-0 to BL-4K). The source of each lower transistor 152 is connected to a second low level global source line (GSL-1) 160. GSL-0 and GSL-1 may be connected together.

Read operations are carried out on a row-by-row basis, so that the entire contents of a given row (e.g., 1024 bytes) are retrieved at a time. To read the contents of row N in FIG. 4, each of the remaining rows of Flash memory cells 130 are supplied with sufficient gate control (GC) voltages along the associated word lines to place the non-selected memory cells are in a conductive state.

A suitable voltage such as VCC (e.g., +3V to turn on the NMOS) is applied to the SSL line 154 to place the upper control transistors 150 in a conductive state. A suitable voltage such as VSS (e.g., ground) is applied to the GSL-0 line 156 to place the lower control transistors 152 in a conductive state. The same VSS voltage can be applied to the GSL-1 line 160. The VCC voltage can also be applied to each of the bit lines BL-0 through BL-4K 158.

A series of stepped threshold voltages are next applied to the word line for the selected row, WL-N 148. In some embodiments, each Flash memory cell 130 can have one of four selected states, each corresponding to a different amount of accumulated charge on the floating gate (FC) 140 (see FIG. 3). Each state can be used to store two bits of data, such as "11," "10," "01," and "00" respectively. The various stepped voltages are sequentially applied to discern, in turn, the respective states of the memory cells 130 along the selected row. This operation can be understood with reference to FIG. 5.

Figure 5:
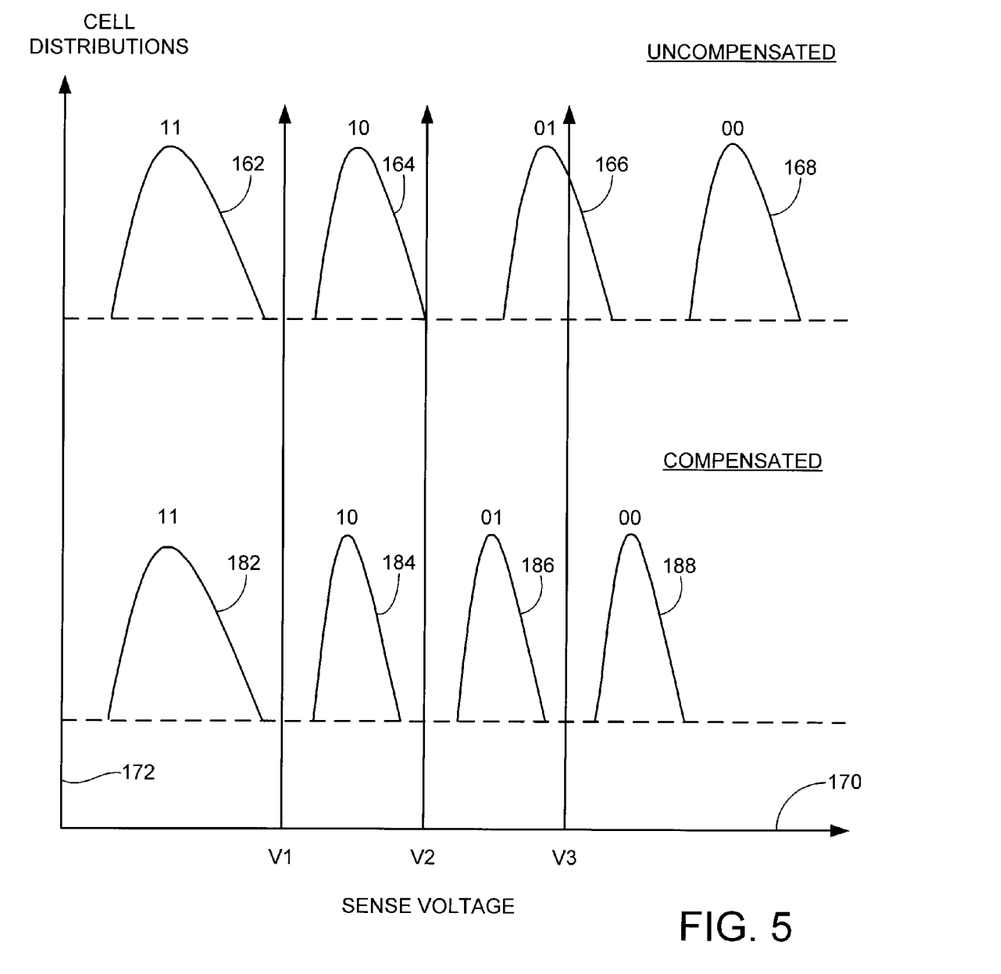
FIG. 5 graphically represents a number of programmed state distributions for the cells in FIG. 4 in accordance with various embodiments of the present invention.

FIG. 5 shows four exemplary memory cell programmed state distributions 162, 164, 166 and 168, plotted against a voltage magnitude x-axis 170 and a common distribution y-axis 172. As shown in FIG. 5, the distributions correspond to the variations that can be exhibited among the various cells 130 when programmed to the respective states "11," "10," "01," and "00." For example, the distribution 162 for programmed (erased) state "11" shows that the control gate voltage required to place the cells into a conductive state vary somewhat around a median value M.

Applying a threshold voltage such as V1, which is above the entire "11" distribution 162, will generally operate to ensure that all of the cells 130 that are programmed to the "11" state will become conductive. The cells 130 that are programmed to the remaining states "10," "01" and "00" will not become conductive responsive to the threshold voltage V1, and so will remain in a non-conductive state. Suitable sense amplifier and latching circuitry (not shown) can be used to sense and temporarily store data corresponding to the detected "11" programmed states.

The WL-N word line 148 in FIG. 4 is next provided with a second voltage, such as voltage V2 in FIG. 5, which will substantially identify all of the cells 130 along the selected row N that are programmed to the "10" level. This pattern continues until all of the cell values have been sensed. The sense amplifier and latching circuitry then outputs the entire contents of the selected row, and if desired, the foregoing process is repeated for a new row of the block 146.

While operable, such processing can be subjected to a number of limitations. The cell distributions for the various states can vary widely, and can even overlap at times due to a number of factors. One factor for such variations can be noted from further review of FIG. 4, which includes a number of resistors 174-178, denoted respectively as R1 to R4K. These resistors represent conductive line resistances that can exist along the various columns between the bit lines BL-0 to BL-4K 148 to the GSL-1 line 160.

While each resistance may be relatively small, it will be appreciated that for larger block sizes, the accumulated series resistance can become quite large. Thus, instead of the drain of the associated cell 130 along a given column having an effective voltage level of VSS, it has been found by the present inventors that these resistances can increase the effective drain voltage of the cell by upwards of about 0.4 volts or more.

This can lead to incorrect sensing operations upon a memory block, since the resistances can shift the locations of the various distributions, as well as increase the localized variation (spread) of the individual distributions. The effects of these variations can be observed in FIG. 5, which shows that the application of a third threshold voltage V3 will fail to correctly determine the programmed state of at least some of the cells in the "01" distribution 166 (i.e., that portion of the "01" distribution that lies to the left of the V3 voltage line).

Accordingly, various embodiments of the present invention generally operate to compensate for cell distribution variations in a memory block. The contents of a selected row of memory cells are read from the memory block by concurrently applying a stepped sequence of threshold voltages to a word line coupled to each of the memory cells along the selected row. Groups of the memory cells along the selected row are sequentially decoupled from a read current applied thereto as the programmed states of said groups of cells are successively determined.

In some embodiments, the memory block comprises a plurality of NAND connected non-volatile memory cells arranged into rows and columns, with each memory cell selectively programmable to a selected state from a plurality of states. A read circuit concurrently reads the selected row by applying a sequence of threshold voltages to a word line coupled to each of the memory cells in the selected row.

In further embodiments, a first group of cells along the selected row programmed to a first selected state are identified by applying a first threshold voltage to the word line. The first group of cells is disconnected from the read current prior to application of a second, higher threshold voltage to the word line to identify a second group of cells along the selected row that are programmed to a second selected state. In some embodiments, each cell is characterized as a Flash memory cell, and each cell stores at least two bits of data.

By dropping out the cells for which the programmed states have already been determined, improved accuracy is provided for the sensing operations for the remaining cells as compared to other approaches that leave all of the cells in the circuit during the read operation. This is graphically illustrated in FIG. 5 by a series of compensated cell distributions 182, 184, 186 and 188, which exhibit improved variation characteristics as compared to the uncompensated distributions 162, 164, 166 and 168.

Figure 6:
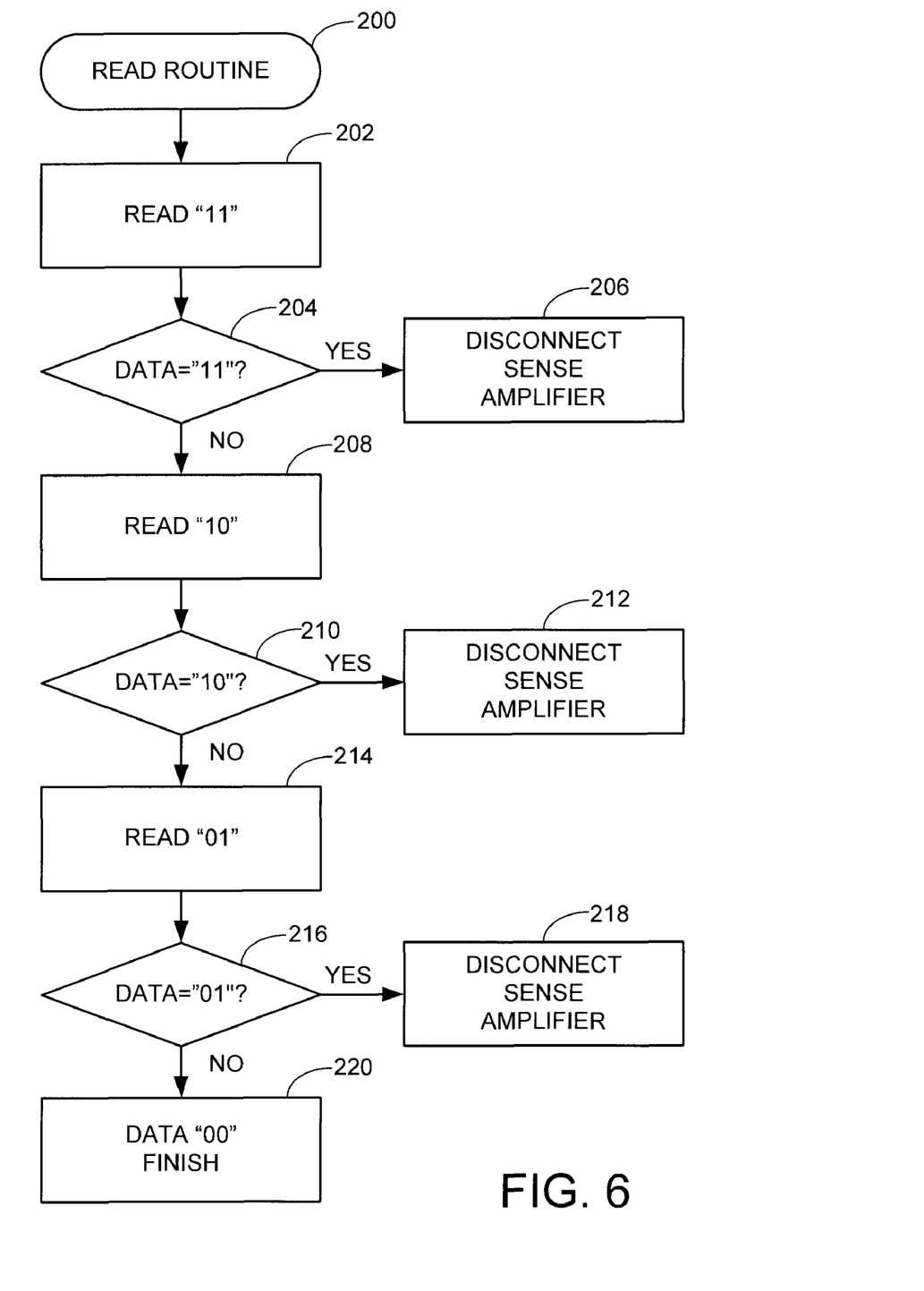
FIG. 6 is a flow chart for a READ ROUTINE generally illustrative of steps carried out in accordance with various embodiments of the present invention.

FIG. 6 provides a READ ROUTINE 200, generally illustrative of steps carried out in accordance with various embodiments to read the contents of a selected row of a memory block. The flow of FIG. 6 will be described with reference to FIGS. 4 and 5, although it will be appreciated that the routine 200 can be readily applied to any number of different types of memory blocks.

At step 202, a read "11" operation is first carried out by applying a first threshold voltage, such as the voltage V1, to the word line for the selected row. As discussed above, this will enable the identification of a first group of cells along the selected row that are programmed to a first programmable state, in this case "11." It is contemplated that these cells can be anywhere along the selected row. This is also the case for the remaining programmed states "10," "01" and "00."

Decision step 204 represents the sensing of this first group of "11" cells on the basis that the first threshold voltage V1 was sufficient to render the cells in a conductive state, thereby pulling the associated bit lines to VSS while the remaining bit lines remained at VCC. The read current is decoupled from the cells in the first group at step 206, such as by disconnecting a sense amplifier circuit of the read circuit (124, FIG. 2) from the cells in the first group.

Disconnecting the cells with a known programmed state will tend to reduce the effects of the parasitic resistances shown in FIG. 4. This will reduce power consumption since less current will be flowing through the memory block. This will also provide enhanced levels of sense accuracy as the read operation continues.

Continuing with FIG. 6, the flow passes to step 208 which performs a read "10" operation. This generally involves applying a second suitable threshold voltage to the word line WL-N, such as the voltage V2 in FIG. 5. This voltage will normally be sufficient to place all of the cells programmed with a "10" in a conductive state, while the cells programmed to "01" and "00" will remain in a non-conductive state. It will be noted that the second voltage V2 would normally also place the cells programmed to "11" in a conductive state; however, the operation of step 206 advantageously took the "11" cells out of the circuit.

Therefore, the only cells that will have bit lines pulled low as a result of step 208 will be those programmed to the "10" state. These cells can be identified as a second group of cells at decision step 210 which are disconnected from further sensing operations at step 212.

The routine next passes to step 214 where a read "01" operation is carried out. This involves application of a third threshold voltage to the word line WL-N, such as the voltage V3 in FIG. 5. This third voltage is sufficient to render conductive the cells programmed to "01" but not those cells programmed to "00." Thus, a third group of cells with the programmed state of "01" are identified at decision step 216 and disconnected at step 218. The remaining cells constitute a fourth group of cells with programmed state of "00," as shown by block 220.

Although not shown, a separate verification step can be carried out as desired to verify the various programmed states, after which the entire contents of the row can be released from the latching circuit. The verification step can utilize the same, or different, voltage threshold values as desired.

Figure 7:
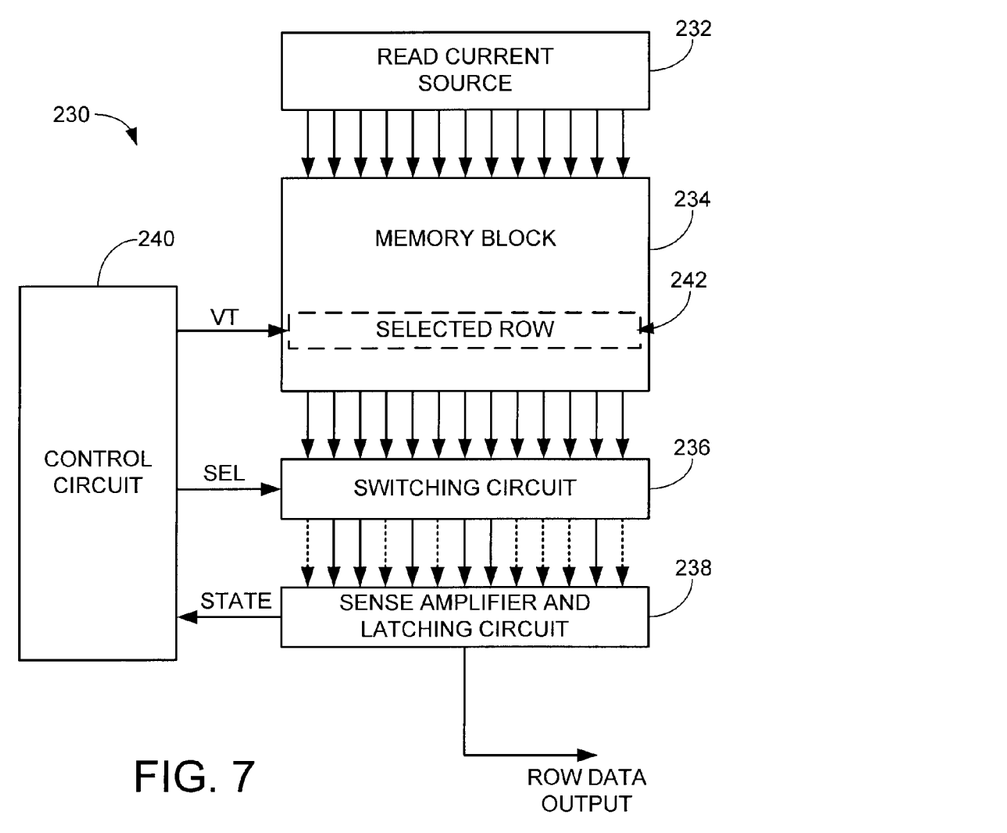
FIG. 7 is a functional block representation of a read circuit configured to carry out the routine of FIG. 6.

FIG. 7 shows a functional block diagram for a read circuit 230 configured to carry out the routine of FIG. 6. FIG. 7 includes a read current source 232 which generates the aforementioned read currents that are coupled to the various columns (e.g., bit lines) of a memory block 234. A switching circuit is denoted at 236, a sense amplifier and latching circuit is denoted at 238 and a control circuit is denoted at 240.

A read operation is carried out upon a selected row 242 of the memory block 234. A sequence of stepped threshold voltages VT are supplied via the control circuit 240 on path 244 to a word line coupled to the memory cells along the selected row 242. The sense amplifier and latching circuit 238 identifies the states of the various cells along the selected row in a sequential manner as discussed above. The circuit 238 provides state information to the control circuit 240 via path 246. The control circuit in turn applies selection (SEL) inputs to the switching circuitry 236 so that the successive groups of cells are decoupled from the sense amplifier (and from the read current), as represented by the dashed arrows leading to the sense amplifier circuitry 238. It will be appreciated that FIG. 7 is merely representational in nature and other configurations can readily be used; for example, switching circuitry can be alternatively or additionally implemented between the read current source 232 and the memory block 234, or incorporated directly into the sense circuit 238.

Figure 8:
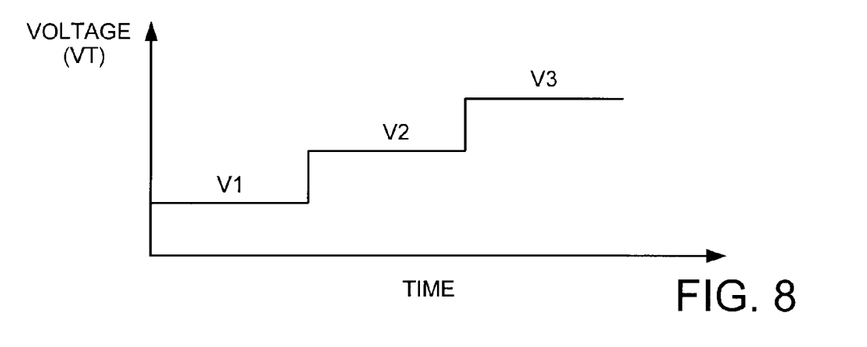
FIG. 8 graphically illustrates a stepped sequence of threshold voltages applied by the circuit of FIG. 7.

FIG. 8 graphically illustrates an exemplary stepped sequence of threshold voltages concurrently applied by the read circuit of FIG. 7 to each memory cell 130 along the selected row 242. During the application of the stepped sequence, the switching circuit 236 sequentially decouples read current from groups of the memory cells along the selected row as the programmed states of said groups of cells are successively determined. The sequence in FIG. 7 shows the three stepped voltages V1, V2 and V3 discussed above in FIGS. 5-6. It will be appreciated that fewer or greater numbers of voltages in the stepped sequence can be applied. For example, if each cell stores four bits (e.g., "1111" to "0000"), a total of 15 different stepped threshold voltages may be applied to differentiate these various states.

Figure 9:
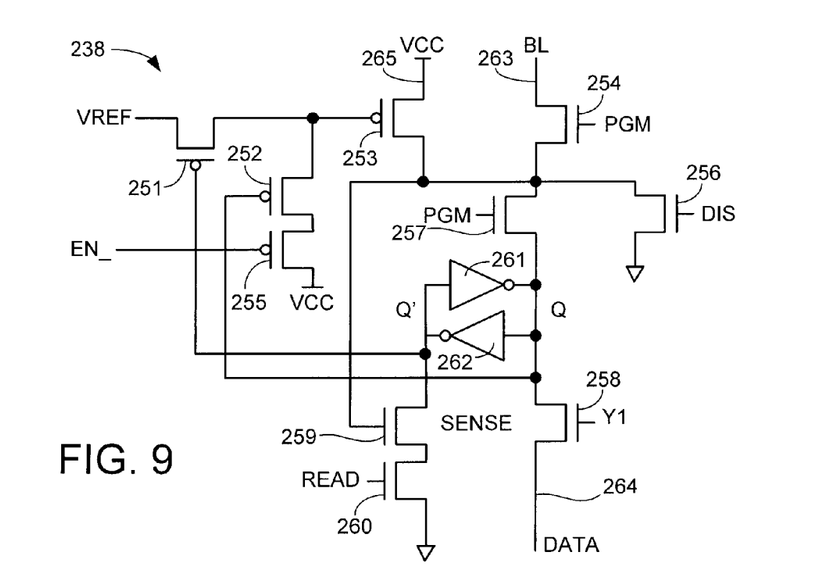
FIG. 9 is a schematic depiction of an exemplary sense amplifier and latching circuit that can be utilized during the routine of FIG. 6.

FIG. 9 provides a schematic representation of the sense amplifier and latching circuit 238 of FIG. 7 in accordance with some embodiments. FIG. 9 is merely exemplary and any number of other configurations can be readily provided by the skilled artisan in accordance with FIG. 7. It will be noted that the switching circuit 236 is shown as a separate functional unit in FIG. 7, although the operation of the switching circuitry is incorporated in the sense circuit 238 in FIG. 9. In some embodiments, a separate set of the circuitry of FIG. 9 is provided for each column (bit line) from the memory block, and each independently operates to switch itself out at the appropriate time during the row read operation once the programmed state of the associated cell is determined.

The circuit 238 in FIG. 9 includes transistors 251-260 and inverters 261, 262 arranged as shown. The inverters form a latch with complementary states Q, Q'. The circuit 238 receives a number of control inputs including a reference voltage VREF, an enable signal EN_, read, program (PGM) and pre-charge signal DIS and column select Y1. These can be supplied from the control circuit 240 or some other source and serve to place the circuit in a condition to read the associated row from the memory block.

When enabled, the circuit 238 operates to compare the current of 253 whose gate is VREF to bit line current of bit line BL 263. The BL 263 is coupled to the cell 130 being sensed. The reference voltage VREF can be a suitable value with a magnitude sufficient to distinguish between a conductive and non-conductive state for the associated cell being sensed.

The voltage at the BL 263 can be lower and the Q state of the inverters can be low (e.g., a logical 1) if the cell is conductive. This low state will be output on a DATA line 264 to a latch (not separately shown) to temporarily store the associated sensed programmed value (e.g., "11").

The complementary state Q' will be low, which will disable the input of the reference voltage VREF via transistor 251. The transistor 254 will become conductive, thereby pulling the BL 263 to VCC via path 265. Thus, the sense amplifier circuit is disabled and no further read current will pass along the BL 263 during the remainder of the row sensing operation since both ends are tied to the 0 voltage.

It is contemplated that in most cases, suitable threshold voltages VT can be reliably selected to distinguish between the various programmed cell distributions. As noted above, as the states of different groups of cells becomes known and the read current is removed from these cells, the remaining cell distributions will become tighter and better defined since the parasitic resistances and other effects associated with the decoupled cells has been removed.

Nevertheless, at the beginning of the read sense operation, the variations of the respective cell distributions may be sufficient great such that a particularly threshold voltage VT intersects a given cell distribution. This is exemplified in FIG. 10, which provides initial, uncompensated cell distributions 272, 274, 276 and 278 for programmed states "11," "10," "01" and "00" respectively. A first threshold voltage V1 indicated by arrow 280 intersects the "11" distribution 272, so that a portion of the cells along the selected row programmed to the "11" state are not rendered conductive. These cells are denoted by cross-hatched portion 282.

Figure 10:
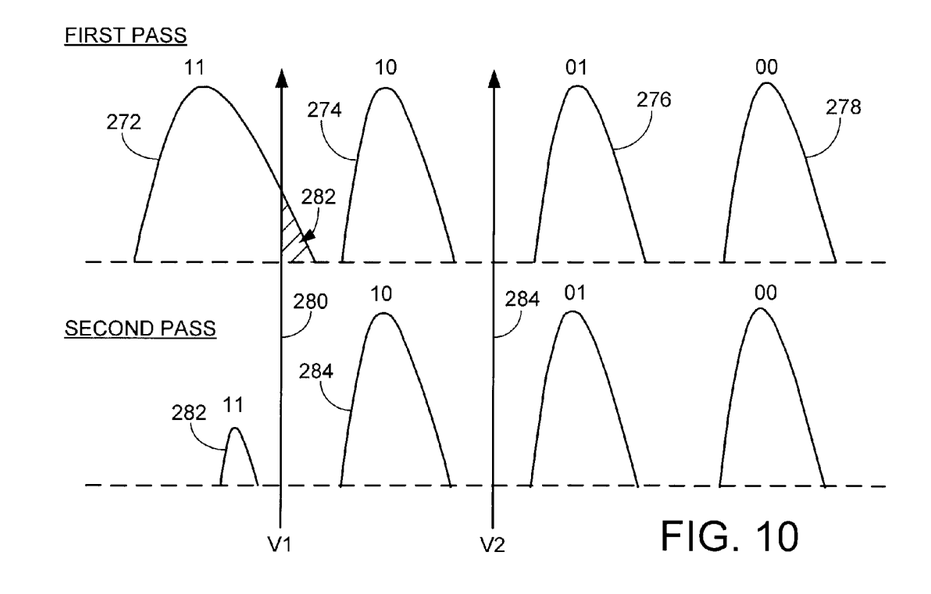
FIG. 10 graphically represents a number of programmed state cell distributions of the during a multi-pass sense operation.

Those skilled in the art will recognize that the cells represented by cross-hatched portion 282 will not be correctly identified as having been programmed to the "11" state. Further, application of a higher, second threshold voltage V1, indicated by arrow 280, will misidentify these cells in portion 282 as being programmed to the "10" state. While error detection and correction circuitry may be able to identify and correct these errors during subsequent processing, this nevertheless increases data processing complexity and can reduce data throughput, particularly if a reread operation is required.

Accordingly, in some embodiments multiple sensing operations can be utilized in an effort to detect such data misreads. As shown in FIG. 10, during a first pass the application of the V1 voltage identifies a first portion of the cells programmed to the "11" state (i.e., those to the right of arrow 280). These cells are decoupled from the sense amplifier as discussed above. During a second pass the V1 voltage is applied a second time. It is contemplated that the removal of the first portion of the cells from the first pass will be sufficient to allow correct detection of the second portion of cells 282 during the second pass, as shown.

The respective threshold voltages can be empirically determined and adaptively adjusted as required, both during read sensing and subsequent verification steps. It will be appreciated that the various embodiments disclosed herein can provide improved read sensing performance, increased data throughput rates, and reduced power consumption over prior art approaches.

While the various embodiments discussed herein have been directed to a NAND configured Flash memory array, it will be appreciated that such is merely illustrative and not limiting to the scope of the claimed subject matter. Any number of different types of construction of memory cells can be used, including but not limited to volatile memory, non-volatile memory, DRAM, SRAM, Flash, EEPROM, STRAM and RRAM, whether configured in a NAND configuration or otherwise. The various embodiments discussed herein have numerous potential applications and are not limited to a certain field of electronic media or type of data storage device.

For purposes of the appended claims, reference to various directions of current will be understood consistent with the foregoing discussion to refer to flowing from a higher potential to a lower potential. The actual movement of electrons will be recognized to be in the opposite direction.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method for use with a memory block comprising a plurality of memory cells arranged into rows and columns and each memory cell configured to have a programmed state, the method comprising:

reading a selected row of the memory block by concurrently applying a stepped sequence of threshold voltages to each memory cell along the selected row while sequentially decoupling read current from groups of memory cells along the selected row as the programmed states of said groups of cells are successively determined.

2. The method of claim 1, wherein the memory cells along each column of the memory block are connected in a NAND configuration.

3. The method of claim 1, wherein the reading step comprises using a read circuit to concurrently read the selected row by applying the stepped sequence of threshold voltages to a word line coupled to each of the memory cells in the selected row and sensing channel conductivity of the respective memory cells responsive to read current applied along respective bit lines coupled to each memory cell.

4. The method of claim 3, wherein the reading step further comprises applying a first threshold voltage to the word line to identify a first group of cells along the selected row programmed to a first selected state, disconnecting the first group of cells from the read current, and applying a second threshold voltage to the word line to identify a second group of cells along the selected row that are programmed to a second selected state.

5. The method of claim 4, wherein the applying a first threshold voltage step further comprises a first pass wherein the first threshold voltage is applied a first time to identify a first portion of the first group of cells, and a second pass wherein the first threshold voltage is subsequently applied a second time to identify a remaining portion of the first group of cells while the first portion of the first group of cells is decoupled from a sense amplifier.

6. The method of claim 1, wherein each cell in the memory block stores at least two bits of data.

7. The method of claim 1, wherein the forming step further comprises providing a plurality of sense amplifier and latching circuits with a selected sense amplifier and latching circuit from said plurality being respectively associated with each column in the memory block.

8. The method of claim 7, wherein the reading step further comprises identifying the programmed state of an associated memory cell in a first column and along the selected row, and decoupling the sense amplifier and latching circuit associated with the first column in response thereto.

9. The method of claim 8, wherein at least one other sense amplifier and latching circuit associated with a second column remains coupled to the second column while the state of an associated memory cell in the second column and along the selected row remains unknown.

10. The method of claim 1, wherein the memory cells are characterized as non-volatile Flash memory cells.

11. An apparatus comprising:
a memory block comprising a plurality of memory cells arranged into rows and columns, each memory cell configured to have a programmed state; and
a read circuit configured to read a selected row of the memory block by concurrently applying a stepped sequence of threshold voltages to each memory cell along the selected row while sequentially decoupling read current from groups of memory cells along the selected row as the programmed states of said groups of cells are successively determined.

12. The apparatus of claim 11, wherein the memory cells along each column of the memory block are connected in a NAND configuration.

13. The apparatus of claim 11, wherein the read circuit applies the stepped sequence of threshold voltages to a word line coupled to each of the memory cells in the selected row while sensing the programmed states of the memory cells along the selected row.

14. The apparatus of claim 13, wherein the read circuit applies a first threshold voltage to the word line to identify a first group of cells along the selected row programmed to a first selected state, disconnects the first group of cells from the read current, and applies a second threshold voltage to the word line to identify a second group of cells along the selected row that are programmed to a second selected state.

15. The apparatus of claim 14, wherein the application of the first threshold voltage comprises a first pass wherein the first threshold voltage is applied a first time to identify a first portion of the first group of cells, and a second pass wherein the first threshold voltage is subsequently applied a second time to identify a remaining portion of the first group of cells while the first portion of the first group of cells is decoupled from a sense amplifier.

16. The apparatus of claim 11, wherein each cell in the memory block stores at least two bits of data.

17. The apparatus of claim 11, wherein the read circuit comprises a plurality of sense amplifier and latching circuits with a selected sense amplifier and latching circuit from said plurality being respectively associated with each column in the memory block.

18. The apparatus of claim 17, wherein the read circuit identifies the programmed state of an associated memory cell in a first column and along the selected row, and decouples the sense amplifier and latching circuit associated with the first column in response thereto.

19. The apparatus of claim 18, wherein at least one other sense amplifier and latching circuit associated with a second column remains coupled to the second column while the state of an associated memory cell in the second column and along the selected row remains unknown.

20. The apparatus of claim 11, wherein the memory cells are characterized as Flash memory cells.

* * * * *